(12) United States Patent
Yamaguchi et al.

(10) Patent No.: US 8,518,550 B2
(45) Date of Patent: *Aug. 27, 2013

(54) POLYIMIDE, POLYIMIDE FILM AND LAMINATED BODY

(75) Inventors: Hiroaki Yamaguchi, Ichihara (JP); Masato Murakami, Ichihara (JP); Masafumi Kohda, Ichihara (JP)

(73) Assignee: UBE Industries, Ltd., Yamaguchi (JP)

( * ) Notice: Subject to any disclaimer, the term of this patent is extended or adjusted under 35 U.S.C. 154(b) by 1066 days.

This patent is subject to a terminal disclaimer.

(21) Appl. No.: 11/667,372

(22) PCT Filed: Aug. 30, 2005

(86) PCT No.: PCT/JP2005/016200
§ 371 (c)(1), (2), (4) Date: May 9, 2007

(87) PCT Pub. No.: WO2006/059415
PCT Pub. Date: Jun. 8, 2006

(65) Prior Publication Data
US 2008/0044681 A1 Feb. 21, 2008

(30) Foreign Application Priority Data
Dec. 3, 2004 (JP) .................. 2004-350773

(51) Int. Cl.
B32B 15/08 (2006.01)
C08G 73/10 (2006.01)

(52) U.S. Cl.
USPC ......... 428/458; 428/457; 428/473.5; 528/322

(58) Field of Classification Search
None
See application file for complete search history.

(56) References Cited

U.S. PATENT DOCUMENTS

| | | |
|---|---|---|
| 5,868,949 A | 2/1999 | Sotokawa et al. |
| 6,350,844 B1 * | 2/2002 | Ono et al. ............... 528/170 |
| 7,267,883 B2 * | 9/2007 | Fujihara et al. ............ 428/473.5 |

FOREIGN PATENT DOCUMENTS

| | | |
|---|---|---|
| JP | 59-86634 A | 5/1984 |
| JP | 2-134241 A | 5/1990 |
| JP | 4-261466 A | 9/1992 |
| JP | 6-299883 A | 10/1994 |
| JP | 7-307114 A | 11/1995 |
| JP | 08-333455 A | 12/1996 |
| JP | 10-265760 A | 10/1998 |
| JP | 2004-224889 A | 8/2004 |

OTHER PUBLICATIONS

T.M. Wu et al., "Effect of draw ratio on the structure of aromatic copolyimide fibers of random monomer sequence," Acta Polymer, vol. 46, No. 3, 1995, pp. 261-266.

* cited by examiner

Primary Examiner — Monique Jackson
(74) Attorney, Agent, or Firm — DLA Piper LLP (US)

(57) ABSTRACT

A polyimide wherein a tetracarboxylic dianhydride including 3,3',4,4'-phenyltetracarboxylic dianhydride as the essential component is the starting tetracarboxylic dianhydride component, and an amine comprising between 0.5 and 30 mole percent of a diamine represented by the following general formula is the starting diamine component.

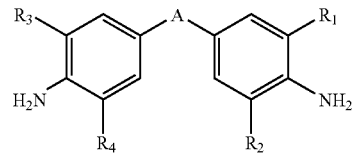

(wherein A is a direct bond or a crosslinking group, and $R_1$-$R_4$ each represent a substituent). It is possible to obtain a polyimide, a polyimide film and a laminated body with an improved adhesion property and an improved moisture permeation rate, even without surface treatment, comprising, as the essential tetracarboxylic dianhydride, 3,3',4,4'-biphenyltetracarboxylic dianhydride which has conventionally only yielded polyimides with low adhesive strength.

17 Claims, No Drawings

POLYIMIDE, POLYIMIDE FILM AND LAMINATED BODY

RELATED APPLICATION

This is a §371 of International Application No. PCT/JP2005/016200, with an international filing date of Aug. 30, 2005 (WO 2006/059415 A1, published Jun. 8, 2006), which is based on Japanese Patent Application No. 2004-350773, filed Dec. 3, 2004.

TECHNICAL FIELD

The technology we describe relates to a novel polyimide, a polyimide film and a laminated body and, more specifically, it relates to a polyimide with a high moisture permeation rate and improved adhesion, wherein the starting tetracarboxylic dianhydride component is a tetracarboxylic dianhydride comprising 3,3',4,4'-biphenyltetracarboxylic dianhydride as an essential component and the starting diamine component is a diamine comprising an aromatic diamine with a specific structure as an essential component, as well as to a polyimide film having a polyimide layer composed of the polyimide on at least one side, and a laminated body thereof.

BACKGROUND

As 3,3',4,4'-biphenyltetracarboxylic dianhydride-based polyimides, which yield heat-resistant polyimides, there are known polyimides comprising 3,3',4,4'-biphenyltetracarboxylic dianhydride and para-phenylenediamine as the starting acid dianhydride component and the starting diamine component, respectively, and these yield polyimides with low linear expansion coefficients and large elastic moduli.

Films made of such polyimides have excellent thermal properties and electrical properties and are therefore widely employed in electronic devices. However, a high adhesive strength cannot be obtained with adhesives ordinarily used in the field of electronics, and laminated bodies with high peel strengths cannot be obtained by forming metal layers by metal vapor deposition or sputtering.

A film composed of such a polyimide has low saturated water absorptivity and a low hygroscopic expansion coefficient and therefore has the advantage of dimensional stability against environmental changes. However, because of its extremely low moisture absorption rate, if it is exposed to high temperature in subsequent soldering steps when it is used as a cover lay film or the like, the trace moisture remaining on the base cannot parmeate the cover lay film and causes foaming or peeling at the adhesive interface.

Attempts have been made to improve the low adhesion of such polyimide films. For example, polyimide films with improved adhesion are known which comprise 0.02-1 wt % of compounds of tin, bismuth or antimony (Japanese Unexamined Patent Publication HEI No. 4-261466, Japanese Unexamined Patent Publication HEI No. 6-299883, Japanese Patent Public Inspection HEI No. 7-503984). However, such polyimide films potentially exhibit poorer electrical properties such as electrical insulation. Also known are techniques for improving the adhesion of polyimide films by plasma discharge treatment (Japanese Unexamined Patent Publication SHO No. 59-86634, Japanese Unexamined Patent Publication HEI No. 2-134241). However, discharge treatment often has an insufficient effect on improving the polyimide film adhesion, and productivity is low because of the requirement for complex post-treatment steps.

It has also been attempted to improve the gas permeability of such polyimide films. For example, polyimide films with improved gas permeability are known which use polyimides obtained from diamines having bulky trimethylsilyl groups bonded to the aromatic rings (Japanese Unexamined Patent Publication No. 2004-224889). Also, it has been attempted to use polyimides with bulky $CF_3$ groups on the aromatic rings to increase the distance between molecular chains and improve the gas permeability (W. J. Koros, G. K. Fleming, Journal of Membrane Science, Holland, 1993, Vol. 83, p. 1-80). However, such starting materials are expensive and cannot be easily applied to industrial use.

SUMMARY

We provide a polyimide, a polyimide film and a laminated body with an improved adhesion property and moisture permeation rate, even without surface treatment, comprising, as the essential tetracarboxylic dianhydride, 3,3',4,4'-biphenyltetracarboxylic dianhydride which has conventionally has only yielded polyimides with low adhesion.

Specifically, we provide a novel polyimide wherein a tetracarboxylic dianhydride comprising 3,3',4,4'-biphenyltetracarboxylic dianhydride as the essential component is the starting tetracarboxylic dianhydride component, and an amine comprising between about 0.5 and about 30 mole percent of a diamine represented by the following general formula is the starting diamine component:

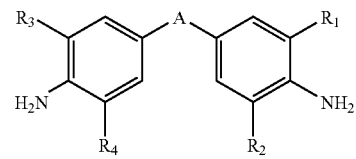

(wherein A is a direct bond or a crosslinking group, $R_1$-$R_4$ each represent a substituent selected from among hydrogen, hydroxyl, carboxyl, C1-6 hydrocarbon groups, C1-6 alkoxy groups and carboalkoxy groups, at least one of $R_1$ and $R_2$ is not hydrogen and at least one of $R_3$ and $R_4$ is not hydrogen).

We further provide a film having on at least one side thereof a layer made of the aforementioned polyimide.

Our technology further relates to a laminated body obtained by laminating a base either directly or via a heat-resistant adhesive, onto at least one side of a layer made of the aforementioned polyimide.

The polyimide can yield a molded article with an improved surface adhesion property and moisture permeation rate, and even with a high elastic modulus, without surface treatment of the molded article.

The polyimide film can also exhibit an improved surface adhesion property and moisture permeation rate even with a high elastic modulus, without surface treatment.

In addition, the laminated body comprises a novel polyimide film with improvement in adhesion with the base and the moisture permeation rate, while maintaining heat resistance, a high elastic modulus and a low linear expansion coefficient, and is therefore resistant to foaming and peeling at the adhesion interface during high-temperature treatment steps.

DETAILED DESCRIPTION

The following may be mentioned as preferred aspects of our technology:

1) The aforementioned polyimide wherein the starting diamine component is para-phenylenediamine.
2) The aforementioned polyimide wherein the starting tetracarboxylic dianhydride component is 3,3',4,4'-biphenyltetracarboxylic dianhydride.
3) The aforementioned polyimide wherein the saturated water absorptivity is between 1.3% and 3%.
4) The aforementioned polyimide film wherein the elastic modulus is at least 400 kg/mm$^2$ and less than 900 kg/mm$^2$.
5) The aforementioned laminated body wherein the base is a metal layer.
6) The aforementioned laminated body wherein the base is a metal foil, and particularly a copper foil.

The polyimide precursor composition used to obtain the polyimide may be obtained by using an organic solvent for polymerization of, for example, a tetracarboxylic dianhydride comprising 3,3',4,4'-biphenyltetracarboxylic dianhydride as the essential component, and a diamine component comprising an aromatic diamine represented by the aforementioned general formula at 0.5-30 mole percent and preferably 1-20 mole percent of the total diamines.

For the tetracarboxylic dianhydride there may be mentioned 3,3',4,4'-biphenyl-tetracarboxylic dianhydride and pyromellitic dianhydride. As a diamine component other than an aromatic diamine represented by the aforementioned general formula for the diamine component there may be mentioned para-phenylenediamine. In particular, the tetracarboxylic dianhydride preferably comprises 3,3',4,4'-biphenyltetracarboxylic dianhydride at 7.5-100 mole percent and especially 15-100 mole percent and pyromellitic dianhydride at 0-92.5 mole percent and especially 0-85 mole percent, based on the total aromatic tetracarboxylic dianhydrides, among which the use of 3,3',4,4'-biphenyltetracarboxylic dianhydride alone is particularly preferred.

The polyimide precursor is preferably present at 1-20 wt % in the organic solvent solution containing the polyimide precursor.

It is preferred to use an aromatic tetracarboxylic dianhydride including 3,3',4,4'-biphenyltetracarboxylic dianhydride as the starting acid dianhydride component, and a combination of para-phenylenediamine and an aromatic diamine with a structure represented by the aforementioned general formula in the proportion mentioned above as the starting diamine component, in order to obtain a polyimide and polyimide film with a high elastic modulus, a high moisture permeation rate and improved adhesion.

In particular, the polyimide precursor composition which yields a polyimide may be obtained by mixing (a) a polyimide precursor solution prepared by polymerization of 3,3',4,4'-biphenyltetracarboxylic dianhydride and para-phenylenediamine in an organic solvent, at 70-99.5 wt % and preferably 80-99 wt % of the total weight of the polyimide precursor, and (b) a polyimide precursor solution prepared by polymerization of 3,3',4,4'-biphenyltetracarboxylic dianhydride and an aromatic diamine represented by the aforementioned general formula in an organic solvent, at 0.5-30 wt % and preferably 1-20 wt % of the total weight of the polyimide precursor.

The (a) polyimide precursor solution and (b) polyimide precursor solution are preferably prepared by reacting the carboxylic dianhydride component and diamine component in equimolar amounts, but in some cases either (a) or (b) may have an acid excess and the other a diamine excess.

In either case, the process of imidization of the polyimide precursor by heating causes breakage and reformation of the bonds of the polymer chain to yield a copolymerized polyimide with block bonding or a random sequence. In the step of heating and drying the cast polyimide precursor solution, the heating results in an initial increase in viscosity, further heating results in a drastic lowering of the viscosity, and still further heating produces a high viscosity, finally yielding a polyimide film composed of a high-molecular weight polyimide.

The aforementioned aromatic tetracarboxylic dianhydride and aromatic diamine are preferably used in proportions within the ranges mentioned above, with other additional diamine components and/or other acid components in a range which does not adversely affect the elastic modulus and linear expansion, and for example, 3,3',4,4'-benzophenonetetracarboxylic dianhydride, 2,2-bis(3,4-dicarboxyphenyl)propane, bis(3,4-dicarboxyphenyl)methane, bis(3,4-dicarboxyphenyl)ether or 2,3',3,4'-biphenyltetracarboxylic dianhydride may be used.

As the crosslinking group A in the aforementioned general formula for the aromatic diamine there may be mentioned oxygen, sulfur, methylene, carbonyl, sulfoxyl, sulfone, 1,1'-ethylidene, 1,2-ethylidene, 2,2'-isopropylidene, 2,2'-hexafluoroisopropylidene, cyclohexylidene, phenylene, 1,3-phenylenedimethylene, 1,4-phenylenedimethylene, 1,3-phenylenediethylidene, 1,4-phenylenediethylidene, 1,3-phenylenedipropylidene, 1,4-phenylenedipropylidene, 1,3-phenylenedioxy, 1,4-phenylenedioxy, biphenylenedioxy, methylenediphenoxy, ethylidenediphenoxy, propylidenediphenoxy, hexafluoropropylidenediphenoxy, oxydiphenoxy, thiodiphenoxy and sulfonediphenoxy, but direct bonding without a crosslinking group is also possible.

$R_1$-$R_4$ in the aforementioned general formula for the aromatic diamine each represent a substituent selected from among hydrogen, C1-6 hydrocarbon groups, hydroxyl, carboxyl, C1-6 alkoxy groups and carboalkoxy groups, and at least one of $R_1$ and $R_2$ is not hydrogen while at least one of $R_3$ and $R_4$ is not hydrogen.

As specific examples of $R_1$-$R_4$ in the aforementioned general formula for the aromatic diamine there may be mentioned hydrocarbon groups such as hydrogen, methyl, ethyl, n-propyl, i-propyl, n-butyl, s-butyl, i-butyl, t-butyl, pentyl, cyclohexyl and phenyl, alkoxy groups such as hydroxyl, methoxy, ethoxy, propoxy and butoxy, and carboalkoxy groups such as carboxyl, carbomethoxy, carboethoxy, carbopropoxy and carbobutoxy. $R_1$-$R_4$ may all be identical, or they may independently differ.

As specific examples of aromatic diamines represented by the aforementioned general formula there may be mentioned 3,3'-dimethyl-4,4'-diaminobiphenyl, 3,3'-dihydroxy-4,4'-diaminobiphenyl, 3,3'-dicarboxy-4,4'-diaminobiphenyl, 3,3'-dimethoxy-4,4'-diaminobiphenyl, 3,3',5,5'-tetramethyl-4,4'-diaminobiphenyl, 4,4'-methylene-bis(2-methylaniline), 4,4'-methylene-bis(2-ethylaniline), 4,4'-methylene-bis(2-isopropylaniline), 4,4'-methylene-bis(2,6-dimethylaniline), 4,4'-methylene-bis(2,6-diethylaniline), 4,4'-methylene-bis(2,6-diisopropylaniline), 3,3'-dihydroxy-4,4'-diaminodiphenylmethane, 3,3'-dicarboxy-4,4'-diaminodiphenylmethane, 3,3'-dicarboxy-4,4'-diamino-5,5'-dimethyldiphenylmethane and o-tolidinesulfone, among which 4,4'-methylene-bis(2,6-dimethylaniline) is preferred.

After mixing both components of the polyimide precursor solution, in cases where it is necessary to cap the amine ends of the polyimide precursor, there may be added a small amount of a dicarboxylic anhydride such as phthalic anhydride or its substituted form (for example, 3-methyl or 4-methylphthalic anhydride), hexahydrophthalic anhydride or its substituted form or succinic anhydride or its substituted form, and phthalic anhydride is a typical example.

In order to control gelling of the film, a phosphorus-based stabilizer, for example, tri-phenyl phosphite or triphenyl phosphate, may be added in a range of 0.01-1% with respect to the solid (polymer) concentration during polymerization of the polyamic acid. An imidization catalyst may also be added to the dope solution in order to accelerate imidization. For example, imidazole, 1-methylimidazole, 2-methylimidazole, 1,2-dimethylimidazole, 2-phenylimidazole, benzimidazole, isoquinoline or a substituted pyridine may be used in a proportion of 0.05-10 wt % and especially 0.1-2 wt % with respect to the polyimide precursor. These will allow imidization to be completed at a relatively low temperature.

The organic solvent used for production of the polyimide precursor, for both (a) and (b), may be N-methyl-2-pyrrolidone, N,N'-dimethylformamide, N,N-dimethylacetamide, N,N-diethylacetamide, dimethylsulfoxide, hexamethylphosphoramide or N-methylcaprolactam. These organic solvents may be used alone or in combinations of two or more.

A polyimide may be produced by using the components mentioned above for polymerization of the diamine components and tetracarboxylic dianhydrides which produce the polyimide precursors of (a) and (b), in their respective organic solvents at a temperature of 0-100° C. and preferably 5-50° C., to prepare solutions of the polyimide precursors (which may be partially imidized so long as a uniform solution state is maintained), mixing both polyimide precursor solutions, and forming a coating or film, drying, imidizing and heat drying (curing) the polyimide precursor solution, wherein the acid component and diamine component of the finally obtained polyimide precursor are in an equimolar ratio and the proportion of the components is within the aforementioned range. The maximum heat treatment temperature for heat drying is preferably in the range of 350-600° C. and especially 400-550° C.

The polyimide may be applied as a coating agent or a film (by heat treating an uncured film using a pin tenter and substantially applying a draft).

For application as a film, the film thickness is approximately 5-200 μm. For application as a coating agent, the thickness is approximately 0.1-2 μm.

It is possible to obtain a polyimide film with an improved adhesion property and an improved moisture permeation rate.

In particular, by further introducing an aromatic diamine with the specific structure represented by the aforementioned general formula into the combination of 3,3',4,4'-biphenyltetracarboxylic dianhydride and para-phenylenediamine as a preferred example, it is possible to obtain a polyimide film with an improved adhesion property and an improved moisture permeation rate while maintaining the characteristics of heat resistance, large elastic modulus and low linear expansion coefficient.

The polyimide film preferably has a large elastic modulus and a low linear expansion coefficient, with an elastic modulus of at least 400 kg/mm$^2$ and less than 900 kg/mm$^2$, and especially at least 500 kg/mm$^2$ and less than 850 kg/mm$^2$, a breaking stress of at least 20 kg/mm$^2$ and especially between 20 kg/mm$^2$ and 50 kg/mm$^2$, and a linear expansion coefficient (100-250° C.) of $1\times10^{-5}$–$3\times10^{-5}$ cm/cm/° C. and especially $1\times10^{-5}$–$2.5\times10^{-5}$ cm/cm/° C.

According to a preferred example, the polyimide film is preferably a polyimide film with a saturated water absorptivity of 1.3-3% and especially 1.5-2.5%.

Preferably, the polyimide film has a relative moisture permeation rate of not lower than 2.5, particularly not lower than 4, especially 4-20.

The polyimide may also be applied as a modified polyimide layer serving as the surface layer on a core layer composed of a heat-resistant polyimide. In this case, the polyimide precursor solution used to produce the polyimide core layer composed of the heat-resistant polyimide may be cast and dried onto a support to form a self-supporting film, and then the surface layer polyimide precursor solution which produces the polyimide of the invention is coated and dried onto both sides thereof to a dry thickness of about 0.1-2 μm, if necessary with coating and drying of the surface layer polyimide precursor solution composition to a dry thickness of about 0.1-2 μm on the other side, followed by heating, removal of the solvent and imidization, to produce a surface-modified polyimide film. The polyimide film preferably has a thickness of about 5-150 μm and especially about 10-125 μm.

The polyimide of the heat-resistant polyimide layer may be a polyimide obtained by polymerization and imidization from an aromatic tetracarboxylic dianhydride comprising 7.5-100 mole percent of 3,3',4,4'-biphenyltetracarboxylic dianhydride and 0-92.5 mole percent of pyromellitic dianhydride, with 15-100 mole percent of p-phenylenediamine and 0-85 mole percent of 4,4'-diaminodiphenylether, a polyimide obtained by copolymerizing pyromellitic dianhydride with 4,4'-diaminodiphenylether and p-phenylenediamine in a proportion (molar ratio) of 90/10-10/90, or a polyimide obtained by polymerizing and imidizing an aromatic tetracarboxylic dianhydride comprising 7.5-100 mole percent of 3,3',4,4'-biphenyltetracarboxylic dianhydride and 0-92.5 mole percent of pyromellitic dianhydride, with o-tolidine.

A laminated base is obtained by laminating a metal layer, and preferably a copper layer, on the polyimide surface layer of the invention on a polyimide film, either directly or via an adhesive. The metal layer may be laminated on one or both sides of the polyimide film.

The metal layer may be obtained by laminating a metal foil by a lamination method, or by forming a metal thin-film and a copper plated layer using a thin-film forming method and an electroplating method.

The lamination method for the copper layer, whereby a metal thin-film and a copper plated layer are formed using a thin-film forming method and an electroplating method, may be any publicly known method.

The laminated body may also be obtained by casting a polyimide precursor solution which produces a polyimide of the invention onto a metal foil, and then conducting thorough heating, drying and imidization.

In the lamination method mentioned above, a heat-resistant adhesive layer is formed on one or both sides of the polyimide film and a metal foil is layered thereover, and then heating and pressurization are carried out to obtain a laminated body. The heat-resistant adhesive is not particularly restricted so long as it is a heat-resistant adhesive used in the field of electronics, and for example, there may be mentioned polyimide-based adhesives, epoxy-modified polyimide-based adhesives, phenol resin-modified epoxy resin adhesives, epoxy-modified acrylic resin-based adhesives and epoxy-modified polyamide-based adhesives. The heat-resistant adhesive layer may be formed by any method which is employed in the field of electronics, and for example, an adhesive solution may be coated and dried onto the aforementioned polyimide film and molded article, or a separately formed film-like adhesive may be attached thereto.

The metal layer may be a simple metal or an alloy, and for example, there may be mentioned copper, aluminum, gold, silver, nickel and stainless steel metal foils and metal plating layers (preferably using any of numerous publicly known technologies including a vapor deposition metal base layer-metal plating layer or chemical metal plating layer); however, a rolled copper foil, electrolytic copper foil or copper plated layer may be mentioned as preferred. The thickness of the metal foil is not particularly restricted but is preferably 0.1 μm to 10 mm, and especially 5-18 μm.

According to a preferred example, the laminated base has a novel polyimide layer, with an improved adhesion property and moisture permeation rate while maintaining the characteristics of heat resistance, a large elastic modulus and a low linear expansion coefficient, and it is therefore resistant to foaming and peeling at the adhesion interface during high-temperature treatment steps.

Other base materials, for example, ceramics, glass bases, silicon wafers, or molded articles of metals or polyimide films of the same or different type, may also be attached to the laminated body of the invention with additional heat-resistant adhesives.

The laminated base serving as the laminated body may be suitably used as the base sheet for an electronic part. For example, it may be suitably used as a printed circuit board, power circuit board, flexible heater or resistor base. It is also useful for insulating films and protective films which are formed on materials with low linear expansion coefficients, such as LSIs and other base materials.

Examples and comparative examples will now be explained for a more detailed description.

STARTING DOPE SYNTHESIS EXAMPLE 1

N,N-dimethylacetamide (DMAc) was added to a reaction vessel, and then para-phenylenediamine (PPD) was added while stirring and circulating nitrogen, and the temperature was kept at 50° C. for complete dissolution. Next, 3,3',4,4'-biphenyltetracarboxylic dianhydride (BPDA), in a proportion for an equimolar amount of the diamine component and dicarboxylic acid component in the solution, was gradually added while noting any heat release, and after completion of the addition, reaction was continued for 3 hours with the temperature kept at 50° C., to obtain a polyimide precursor solution with a monomer concentration of 18 wt % (yellow viscous liquid, solution viscosity at 25° C.=approximately 1000 poise). The solution was designated as solution 1.

STARTING DOPE SYNTHESIS EXAMPLE 2

Reaction was conducted in the same manner as Synthesis Example 1 except for adding 3,3'-dicarboxy-4,4'-diaminodiphenylmethane (MBAA) instead of PPD, to obtain a polyimide precursor solution with a monomer concentration of 18 wt % (light brown viscous liquid, solution viscosity at 25° C.=approximately 500 poise). The solution was designated as solution 2.

STARTING DOPE SYNTHESIS EXAMPLE 3

Reaction was conducted in the same manner as Synthesis Example 1 except for adding 4,4'-methylene-bis(2,6-dimethylaniline) (MDX) instead of PPD, to obtain a polyimide pre-cursor solution with a monomer concentration of 18 wt % (light brown viscous liquid, solution viscosity at 25° C.=approximately 1000 poise). The solution was designated as solution 3.

STARTING DOPE SYNTHESIS EXAMPLE 4

Reaction was conducted in the same manner as Synthesis Example 1 except for adding 4,4'-methylene-bis(2-methylaniline) (MDT) instead of PPD, to obtain a polyimide precursor solution with a monomer concentration of 18 wt % (dark red viscous liquid, solution viscosity at 25° C.=approximately 1000 poise). The solution was designated as solution 4.

STARTING DOPE SYNTHESIS EXAMPLE 5

Reaction was conducted in the same manner as Synthesis Example 1 except for adding 3,3'-dimethoxy-4,4'-diaminobiphenyl (DANS) instead of PPD, to obtain a polyimide precursor solution with a monomer concentration of 18 wt % (light blackish brown viscous liquid, solution viscosity at 25° C.=approximately 1500 poise). The solution was designated as solution 5.

STARTING DOPE SYNTHESIS EXAMPLE 6

Reaction was conducted in the same manner as Synthesis Example 1 except for adding 3,3'-dimethyl-4,4'-diaminobiphenyl (TB) instead of PPD, to obtain a polyimide precursor solution with a monomer concentration of 18 wt % (light brown viscous liquid, solution viscosity at 25° C.=approximately 800 poise). The solution was designated as solution 6.

EXAMPLES 1-5

Solution 1 was mixed with solutions 2-6 in the proportions shown in Table 1, each mixture was coated onto a glass panel to a final film thickness of about 25 μm, heated at 135° C. for 3 minutes to form a solidified film, released from the glass panel and then spread on a pin tenter and heated at 130° C. for 5 minutes, 180° C. for 5 minutes, 210° C. for 5 minutes and 320° C. for 2 minutes, after which the temperature was increased to 450° C. within 5 minutes and kept at 450° C. for 2 minutes for heat treatment to obtain a polyimide film. The obtained polyimide film was dried to a constant weight under a dry nitrogen atmosphere and then immersed in purified water at 23° C. for 24 hours and, after wiping off the adhered water, the saturated water absorptivity was determined from the change in weight. Next, the obtained polyimide film was dried to a constant weight under a dry nitrogen atmosphere and then the change in weight at 27° C., 55% RH was measured, to determine the relative moisture absorption rate. Also, the tensile properties of the obtained polyimide film, at a thickness of 25 μm, were evaluated according to ASTM D882 method.

Next, an acrylic-based adhesive (PYRALUX) by DuPont Corp. and a rolled copper foil (BHY-13H-T foil, Ra: 0.18 μm, product of Nikko Materials Co., Ltd.) were laminated on the obtained polyimide film, compression bonded for 1 minute with a press at 180° C., 30 Kgf/cm², and further heat treated at 180° C. for 60 minutes to obtain a laminated sheet. The 90° peel strength at the interface of the laminated sheet was measured to evaluate the adhesive strength. The results are shown in Table 1. None of the films exhibited a distinct glass transition temperature at below 450° C.

COMPARATIVE EXAMPLE 1

A single-layer polyimide film (25 μm) was obtained in the same manner as Example 1, except for using solution 1 alone. The polyimide film was evaluated in the same manner as in Example 1.

TABLE 1

| | Starting dope Proportion (monomer mole %) | | Adhesive strength (Kg/cm) | | Saturated water absorptivity % | Relative moisture permeation rate | Tensile modulus (kg/mm$^2$) |
|---|---|---|---|---|---|---|---|
| Example 1 | Solution 1 93 | Solution 2 7 | Side A 0.9 | Side B 1.1 | 2.2 | 28 | 750 |
| Example 2 | Solution 1 89 | Solution 3 11 | Side A 0.85 | Side B 1.0 | 1.9 | 25 | 760 |
| Example 3 | Solution 1 92 | Solution 4 8 | Side A 0.8 | Side B 1.0 | 1.8 | 14 | 800 |
| Example 4 | Solution 1 92 | Solution 5 8 | Side A 0.4 | Side B 0.6 | 1.7 | 16 | 790 |
| Example 5 | Solution 1 83 | Solution 6 17 | Side A 0.6 | Side B 0.8 | 1.8 | 5 | 850 |
| Comp. Ex. 1 | Solution 1 100 | — | Side A 0.3 | Side B 0.4 | 1.25 | 1.8 | 900 |

Side A: Air side during casting (free side)
Side B: Base side during casting

EXAMPLES 6-12

Solution 1 was mixed with solution 3 in the proportions shown in Table 2, and then each mixture was coated onto a glass panel to a final film thickness of 25 μm and 50 μm and heated at 135° C. for 3 minutes (final thickness: 25 μm) or 5 minutes (final thickness: 50 μm) to form solidified films, released from the glass panel and spread on a pin tenter and heated at 130° C. for 5 minutes, 180° C. for 5 minutes, 210° C. for 5 minutes and 320° C. for 2 minutes, after which the temperature was increased to 450° C. within 5 minutes and kept at 450° C. for 2 minutes for heat treatment to obtain a polyimide film. The obtained polyimide film was dried to a constant weight under a dry nitrogen atmosphere and then immersed in purified water at 23° C. for 24 hours and, after wiping off the adhered water, the saturated water absorptivity was determined from the change in weight. Next, the obtained polyimide film was dried to a constant weight under a dry nitrogen atmosphere and then the change in weight at 27° C., 55% RH was measured, to determine the relative moisture absorption rate. Also, the tensile properties of the obtained polyimide film, at a thickness of 25 μm, were evaluated according to ASTM D882 method. The results are shown in Table 2.

COMPARATIVE EXAMPLE 2

A polyimide film was obtained in the same manner as Example 6, except for using solution A alone. The polyimide film was evaluated in the same manner as in Example 6.

EXAMPLE 13

Solution 1 was coated onto a glass panel to a final thickness of about 21 μm and heated at 135° C. for 3 minutes to form a solidified film (base layer), and then a polyimide precursor solution obtained by mixing solution 1: solution 3=90:10 (molar ratio) and adjusted to a monomer concentration of 5 wt % was coated onto side A to a final film thickness of 2 μm and heated at 135° C. for 1 minute, after which it was released from the glass panel, and then side B was coated in the same manner and heated at 135° C. for 1 minute, and the solidified film was released from the glass panel. The film was then spread on a pin tenter and heated at 130° C. for 5 minutes, 180° C. for 5 minutes, 210° C. for 5 minutes and 320° C. for 2 minutes, after which the temperature was increased to 450° C. within 5 minutes and kept at 450° C. for 2 minutes for heat treatment to obtain a polyimide film. The thicknesses of the layers of the obtained trilayer polyimide film were 2 μm/21 μm/2 μm. The obtained polyimide film was dried to a constant weight under a dry nitrogen atmosphere and then immersed in purified water at 23° C. for 24 hours and the saturated water absorptivity was determined from the change in weight after wiping off the adhered water. Next, the obtained polyimide film was dried to a constant weight under a dry nitrogen atmosphere and then the change in weight at 27° C., 55% RH was measured to determine the relative moisture absorption rate. Also, the tensile properties of the obtained polyimide film, at a thickness of 25 μm, were evaluated according to ASTM D882 method.

TABLE 2

| | Starting dope proportion Solution 1:Solution 3 (monomer mole %) | Saturated water absorptivity (%) | | Relative moisture permeation rate | | Linear expansion coefficient ($\times 10^{-6}$ cm/cm/° C.) | | Breaking stress (kg/mm$^2$) | Tensile modulus (kg/mm$^2$) | Breaking elongation (%) |
|---|---|---|---|---|---|---|---|---|---|---|
| | | 25μ | 50μ | 25μ | 50μ | 25μ | 50μ | | | |
| Example 6 | 98.0:2.0 | 1.4 | 1.6 | 7.3 | 2.8 | 13 | 19 | 47 | 860 | 44 |
| Example 7 | 95.5:4.5 | 1.7 | 1.9 | 10 | 4.4 | 14 | 20 | 45 | 820 | 41 |
| Example 8 | 95.0:5.0 | 1.7 | 1.9 | 12 | 4.7 | 15 | 22 | 45 | 820 | 40 |
| Example 9 | 92.5:7.5 | 1.9 | 2.1 | 16 | 6.2 | 18 | 25 | 43 | 790 | 38 |
| Example 10 | 90.0:10.0 | 2.0 | 2.2 | 20 | 9.4 | 19 | 27 | 40 | 760 | 34 |
| Example 11 | 88.5:11.5 | 1.9 | 2.2 | 25 | 12 | 19 | 28 | 39 | 760 | 32 |
| Example 12 | 85.0:15.0 | 2.2 | 2.4 | 33 | 16 | 21 | 30 | 38 | 750 | 29 |
| Comp. Ex. 2 | 100:0.0 | 1.25 | 1.4 | 1.8 | 1.0 | 12 | 17 | 52 | 900 | 42 |

Next, an acrylic-based adhesive (PYRALUX) by DuPont Corp. and a rolled copper foil (BHY-13H-T foil, Ra: 0.18 μm, product of Nikko Materials Co., Ltd.) were laminated on the obtained polyimide film, compression bonded for 1 minute with a press at 180° C., 30 Kgf/cm², and further heat treated at 180° C. for 60 minutes to obtain a laminated sheet. The 90° peel strength at the interface of the laminated sheet was measured to evaluate the adhesive strength. The results are shown in Table 3.

EXAMPLE 14

The same evaluation was conducted as in Example 13, except that the coating thicknesses were adjusted so that the thicknesses of the layers of the trilayer polyimide film were 1 μm/10 μm/1 μm. The results are shown in Table 3.

EXAMPLE 15

The same evaluation was conducted as in Example 13, except that the base layer was formed using a solution obtained by adding 1,2-dimethylimidazole to solution 1 at 2 wt % with respect to the polyimide precursor. The results are shown in Table 3.

COMPARATIVE EXAMPLE 3

The same evaluation was conducted as in Example 13, except that only a base layer was formed, using a solution obtained by adding 1,2-dimethylimidazole to solution 1 at 2 wt % with respect to the polyimide precursor. The results are shown in Table 3.

TABLE 3

| Film | Adhesive strength (Kg/cm) | | Saturated water absorptivity | Relative moisture permeation |
|---|---|---|---|---|
| | thickness | Side A | Side B | % | rate |
| Example 13 | 2μ/21μ/2μ | 0.9 | 1.0 | 1.4 | 7 |
| Example 14 | 1μ/10μ/1μ | 0.7 | 0.9 | 1.4 | 12 |
| Example 15 | 1μ/10μ/1μ | 0.6 | 0.7 | 1.4 | 13 |
| Comp. Ex. 3 | 0μ/12μ/0μ | 0.2 | 0.2 | 1.2 | 2.5 |

The laminated sheets obtained in Examples 1-5, Comparative Example 1, Examples 13-15 and Comparative Example 3 were evaluated in regard to foaming and peeling at the adhesion interface during the high-temperature treatment steps, by the following evaluation method.

Evaluation method: The laminated body bonded on one side to a copper foil was immersed in purified water at 23° C. for 24 hours, and after wiping off the adhered water, it was immersed for 10 seconds in a soldering bath at 280° C. The results were as follows:

Foaming and peeling found: Comparative Examples 1, 3
Slight foaming found: Example 5
No foaming found: Examples 1-4, Examples 13-15.

INDUSTRIAL APPLICABILITY

We provide a polyimide molded film with a large elastic modulus and an improved surface adhesion property and an improved moisture permeation rate, and is therefore of high industrial utility.

The invention claimed is:
1. A polyimide comprising:
   a tetracarboxylic dianhydride comprising 3,3',4,4'-biphenyltetracarboxylic dianhydride as an essential component as a starting tetracarboxylic dianhydride component, and
   a first amine comprising between about 0.5 and about 30 mole percent of a diamine, 4,4' methylene-bis-(2,6-dimethylaniline), and the polyimide has a saturated water absorptivity of 1.3-3%.
2. The polyimide according to claim 1 further comprising a second starting diamine, which is para-phenylenediamine.
3. The polyimide according to claim 2, wherein the starting dicarboxylic dian-hydride component is 3,3',4,4'-biphenyltetracarboxylic dianhydride.
4. The polyimide according to claim 1, wherein the starting dicarboxylic dianhydride component is 3,3',4,4'-biphenyltetracarboxylic dianhydride.
5. The polyimide according to claim 1, having a relative moisture permeation rate not lower than 2.5.
6. A polyimide film having on at least one side a layer comprising a polyimide according to claim 1.
7. The polyimide film according to claim 6, having an elastic modulus of at least about 400 kg/mm² and less than about 900 kg/mm².
8. A polyimide film having on at least one side a layer comprising a polyimide according to claim 2.
9. A polyimide film having on at least one side a layer comprising a polyimide according to claim 3.
10. A polyimide film having on at least one side a layer comprising a polyimide according to claim 4.
11. A laminated body obtained by laminating a base onto at least one side of a layer comprising a polyimide according to claim 1, either directly or via a heat-resistant adhesive.
12. A laminated body obtained by laminating a base onto at least one side of a layer comprising a polyimide according to claim 2, either directly or via a heat-resistant adhesive.
13. A laminated body obtained by laminating a base onto at least one side of a layer comprising a polyimide according to claim 3, either directly or via a heat-resistant adhesive.
14. A laminated body obtained by laminating a base onto at least one side of a layer comprising a polyimide according to claim 4, either directly or via a heat-resistant adhesive.
15. The laminated body according to claim 11, wherein the base is a metal layer.
16. The laminated body according to claim 15, wherein the base is a metal foil.
17. The laminated body according to claim 16, wherein the metal foil is a copper foil.

* * * * *